US008902650B2

(12) United States Patent  
Goldman et al.

(10) Patent No.: US 8,902,650 B2  
(45) Date of Patent: Dec. 2, 2014

(54) MEMORY DEVICES AND OPERATING METHODS FOR A MEMORY DEVICE

(75) Inventors: Matthew Goldman, Folsom, CA (US);  
Mark A. Helm, Santa Cruz, CA (US);  
Jaydip B. Patel, Folsom, CA (US);  
Thomas F. Ryan, Folsom, CA (US)

(73) Assignee: Micron Technology, Inc., Boise, ID (US)

( * ) Notice: Subject to any disclaimer, the term of this patent is extended or adjusted under 35 U.S.C. 154(b) by 3 days.

(21) Appl. No.: 13/599,208

(22) Filed: Aug. 30, 2012

(65) Prior Publication Data

US 2014/0063937 A1 Mar. 6, 2014

(51) Int. Cl.  
*G11C 16/04* (2006.01)

(52) U.S. Cl.  
CPC .................................. *G11C 16/0483* (2013.01)  
USPC ............. 365/185.03; 365/185.17; 365/185.28

(58) Field of Classification Search  
CPC ..................................................... G11C 16/0483  
USPC ..................................................... 365/185.03  
See application file for complete search history.

(56) References Cited

U.S. PATENT DOCUMENTS

| | | | | |
|---|---|---|---|---|
| 7,180,775 B2* | 2/2007 | Meir | | 365/185.03 |
| 7,453,712 B2* | 11/2008 | Kim et al. | | 365/63 |
| 7,508,732 B2* | 3/2009 | Park et al. | | 365/235 |
| 7,518,914 B2* | 4/2009 | Han | | 365/185.05 |
| 7,539,053 B2* | 5/2009 | Kanda | | 365/185.03 |
| 7,773,417 B2* | 8/2010 | Tsuji et al. | | 365/185.03 |
| 7,791,939 B2* | 9/2010 | Kim et al. | | 365/185.05 |
| 7,889,558 B2* | 2/2011 | Kanda | | 365/185.17 |
| 7,965,549 B2* | 6/2011 | Kinoshita | | 365/185.03 |
| 8,072,804 B2* | 12/2011 | Lee et al. | | 365/185.03 |
| 8,228,735 B2* | 7/2012 | Puzzilli et al. | | 365/185.14 |
| 2009/0113115 A1* | 4/2009 | Nazarian et al. | | 711/103 |
| 2009/0231942 A1 | 9/2009 | Lee et al. | | |
| 2009/0296478 A1 | 12/2009 | Kim et al. | | |
| 2010/0008140 A1* | 1/2010 | Lee | | 365/185.03 |
| 2010/0020601 A1* | 1/2010 | Lee et al. | | 365/185.03 |
| 2013/0258781 A1* | 10/2013 | Goda et al. | | 365/185.17 |

OTHER PUBLICATIONS

"International Search Report", PCT/ISA/210, PCT/US2013/056826, Korean Intellectual Property Office, Mailed Dec. 30, 2013, 3 pgs.

* cited by examiner

*Primary Examiner* — Son Mai  
(74) *Attorney, Agent, or Firm* — Dicke, Billig & Czaja, PLLC

(57) ABSTRACT

Devices and methods facilitate memory device operation in all bit line architecture memory devices. In at least one embodiment, memory cells comprising alternating rows are concurrently programmed by row and concurrently sensed by row at a first density whereas memory cells comprising different alternating rows are concurrently programmed by row and concurrently sensed by row at a second density. In at least one additional embodiment, memory cells comprising alternating tiers of memory cells are programmed and sensed by tier at a first density and memory cells comprising different alternating tiers of memory cells are programmed and sensed by tier at a second density.

17 Claims, 6 Drawing Sheets

MEMORY DEVICES AND OPERATING METHODS FOR A MEMORY DEVICE

TECHNICAL FIELD

The present disclosure relates generally to semiconductor memories and, in particular, in one or more embodiments, the present disclosure relates to operating all bit line memory devices.

BACKGROUND

Memory devices are typically provided as internal, semiconductor, integrated circuits in computers or other electronic devices. There are many different types of memory including random-access memory (RAM), read only memory (ROM), dynamic random access memory (DRAM), synchronous dynamic random access memory (SDRAM), and flash memory.

Flash memory devices have developed into a popular source of non-volatile memory for a wide range of electronic applications. Non-volatile memory is memory that can retain its stored data for some extended period without the application of power. Common uses for flash memory and other non-volatile memory include personal computers, personal digital assistants (PDAs), digital cameras, digital media players, digital recorders, games, appliances, vehicles, wireless devices, mobile telephones and removable memory modules, and the uses for non-volatile memory continue to expand.

Flash memory typically utilizes one of two basic architectures known as NOR Flash and NAND Flash. For example, a NAND flash memory device is a common type of flash memory device, so called for the logical form in which the basic memory cell configuration is arranged and accessed. Typically, the array of memory cells for NAND flash memory devices is arranged such that memory cells are coupled together in series (e.g., coupled source to drain) to form strings of memory cells. Changes in threshold voltage of the memory cells, through programming (which is sometimes referred to as writing) of charge storage structures (e.g., floating gates or charge traps) or other physical phenomena (e.g., phase change or polarization), determine the data value of each cell.

Two examples of architectures for programming (e.g., writing) and/or sensing (e.g., reading) memory cells of an array are shielded data line (e.g., shielded bit line) and non-shielded data line (e.g., non-shielded bit line) architectures. In a shielded bit line architecture, memory cells coupled to odd numbered (e.g., alternating) bit lines may be programmed while the adjacent even numbered (e.g., alternating) bit lines are inhibited. During a subsequent programming operation, the odd numbered bit lines may be inhibited while memory cells coupled to the even numbered bit lines are programmed. Thus, the inhibited bit lines facilitate a shielding effect on the strings of memory cells which are being programmed. Sense operations in shielded bit line architecture devices are also performed by sensing alternating selected bit lines while inhibiting unselected alternating bit lines. In non-shielded bit line architectures, commonly referred to as all bit line (ABL) architectures, memory cells coupled to all bit lines may be programmed and sensed concurrently.

One technique used to increase the memory capacity of a NAND memory device is to form the memory array in a three dimensional (3D) manner. In other words, instead of the series memory strings being formed horizontally on a memory die which is typically referred to as 2D memory, the series strings are formed vertically on a substrate.

Memory cells, such as flash memory cells, may be configured as what are known in the art as Single Level Memory Cells (SLC) or Multilevel Memory Cells (MLC). SLC and MLC memory cells assign a data state (e.g., representing a respective value of one or more bits) to a specific range of threshold voltages (Vt) stored on the memory cells. Single level memory cells (SLC) permit the storage of a single binary digit (e.g., bit) of data on each memory cell. Meanwhile, MLC technology permits the storage of two or more binary digits per cell (e.g., 2, 3, 4, 5 bits), depending on the quantity of Vt ranges assigned to the cell and the stability of the assigned Vt ranges during the lifetime operation of the memory cell. By way of example, one bit (e.g., 1 or 0) may be represented by two Vt ranges, two bits by four ranges, three bits by eight ranges, etc. Memory cells programmed to store two bits might be referred to as MLC(four-level), as the two bits might be represented by four Vt ranges which might be stored in the memory cells. Memory cells programmed to store three bits might be referred to as MLC(eight-level), as three bits might be represented by eight Vt ranges which might be stored in the memory cells, and so on.

While memory cells programmed as MLC memory cells are able to store more bits of data per cell than SLC memory cells, MLC memory cells typically have lower reliability characteristics than SLC memory. ABL memory devices are typically programmed wherein all of the memory cells are programmed as SLC or at the same level of MLC levels, for example. Thus, a trade-off generally exists between storing more data in an array of memory cells and an expected reliability level associated with the data stored at a particular MLC level in the array of memory cells.

A typically undesirable effect which can occur when programming memory cells is referred to as program disturb. A programming operation performed on a particular memory cell might disturb a programmed data state of one or more nearby (e.g., adjacent) memory cells. This can corrupt data stored in these nearby memory cells. These disturb effects tend to increase as the MLC level increases, such as from programming memory cells as MLC(two-level) to programming memory cells as MLC(three-level), for example.

For the reasons stated above, and for other reasons stated below which will become apparent to those skilled in the art upon reading and understanding the present specification, there is a need in the art for alternative methods of operating all bit line memory devices.

DETAILED DESCRIPTION

Figure 1:
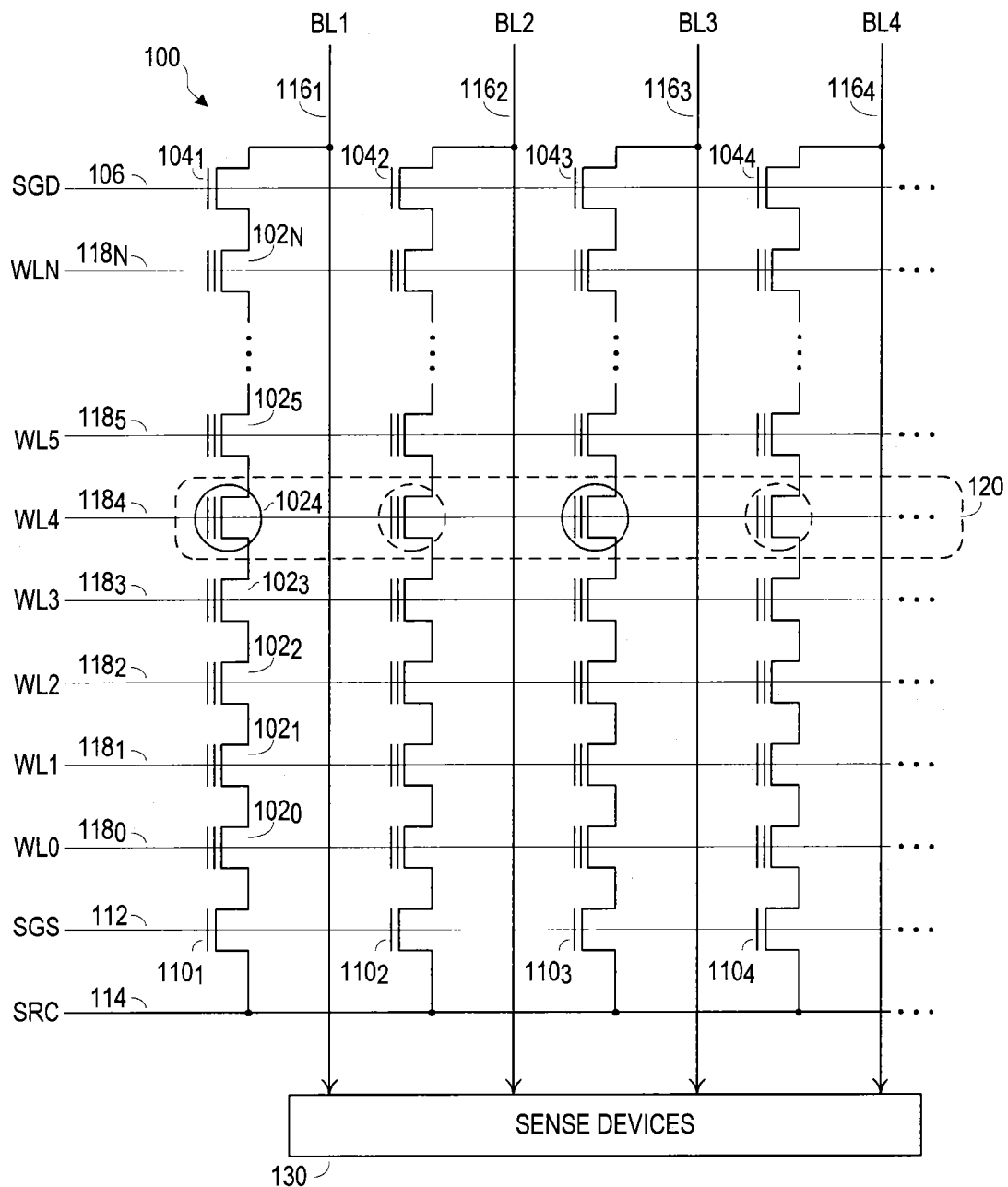
FIG. 1 illustrates a schematic representation of an array of NAND configured memory cells.

In the following detailed description of the invention, reference is made to the accompanying drawings that form a part hereof, and in which is shown, by way of illustration, specific embodiments. In the drawings, like numerals describe substantially similar components throughout the several views. Other embodiments may be utilized and structural, logical, and electrical changes may be made without departing from the scope of the present disclosure. The following detailed description is, therefore, not to be taken in a limiting sense.

FIG. 1 illustrates a schematic representation of a shielded bit line NAND architecture memory array 100 wherein charge storage memory cells 102 of the memory array 100 are logically arranged in an array of rows and columns. In a conventional NAND architecture, "rows" refers to two or more memory cells having commonly coupled control gates, while "columns" refers to memory cells coupled as one or more NAND strings of memory cells 102, for example. The schematic representation shown might be representative of a portion of a 2D memory array architecture. The memory cells 102 of the memory array 100 are arranged together in strings (e.g., NAND strings), typically of 8, 16, 32, or more each. Memory cells of a string 102 are connected together in series, source to drain, between a source line 114 and a data line 116, often referred to as a bit line. Each string of memory cells 102 is coupled to source line 114 by a source select gate, such as select gates 110 and to an individual bit line 116 by drain select gates 104, for example. The source select gates 110 are controlled by a source select gate (SGS) control line 112 coupled to their control gates. The drain select gates 104 are controlled by a drain select gate (SGD) control line 106. The one or more strings of memory cells 102 of a memory array 100 are typically arranged in groups (e.g., blocks) of memory cells.

The memory array 100 is accessed by a string driver (not shown) configured to activate a row of memory cells by selecting a particular access line 118, often referred to as a word line. Each word line 118 (e.g., WLN-WL0 $118_{N-0}$) is coupled to a row of memory cells, such as row 120, for example. Bit lines BL1-BL4 $116_1$-$116_4$ can be biased to a particular potential depending on the type of operation being performed on the array. Bit lines BL1-BL4 116 are coupled to sense devices (e.g., sense amplifiers) 130 that detect the data state of each cell by sensing voltage or current on a particular bit line 116. As is known to those skilled in the art, the number of word lines and/or bit lines might be much greater than those shown in FIG. 1.

Programming typically involves applying one or more programming pulses (Vpgm) to a selected word line 118, such as WL4 $118_4$, and thus to the control gates of the row of memory cells 120 coupled to the selected word line $118_4$. Typical programming pulses (Vpgm) may start at or near 15V and tend to increase in magnitude during each subsequent programming pulse application. While the program potential (e.g., programming pulse) is applied to the selected word line $118_4$, a potential, such as a ground potential (e.g., 0V), may be applied to the substrate, and thus to the channels of these memory cells, resulting in a charge transfer from the channel to the charge storage structures of memory cells targeted for programming. For example, floating gates are typically charged through direct injection or Fowler-Nordheim tunneling of electrons from the channel to the floating gate, resulting in a Vt typically greater than zero in a programmed state. In the example of FIG. 1, a potential is applied to one or more unselected word lines $118_{N-5}$ and $118_{3-0}$. This potential might be 10V, for example. The potential applied to each unselected word line might be different potentials. A word line adjacent to the selected word line might be biased to a potential of 8V and the next adjacent word line might be biased to 7V, for example. These potentials are not high enough to cause programming of the unselected memory cells. One or more additional unselected word lines might be biased to a potential such as to 0V.

An inhibit potential is typically applied to bit lines 116 (e.g., Vcc) which are not coupled to a NAND string containing a memory cell 102 that is targeted for programming. During a programming operation in a shielded bit line architecture, for example, alternate bit lines 116 may be enabled and inhibited from programming. Even numbered bit lines 116 (e.g., $116_2$ and $116_4$) might be enabled for programming of memory cells coupled to even numbered bit lines $116_{2,4}$ while the odd numbered bit lines 116 (e.g., $116_1$ and $116_3$) are inhibited from programming memory cells coupled to the odd numbered bit lines. A subsequent programming operation might then inhibit the even numbered bit lines $116_{2,4}$ and enable the odd numbered bit lines $116_{1,3}$. For example, the memory cells 102 of row 120 having solid line circles are selected for programming whereas the memory cells 102 having dashed line circles are inhibited from programming as shown in FIG. 1.

Between the application of one or more programming (e.g., Vpgm) pulses, a verify operation is typically performed to check each selected memory cell to determine if it has reached its intended programmed state. If a selected memory cell has reached its intended programmed state it is inhibited from further programming if there remain other memory cells of the selected row still requiring additional programming pulses to reach their intended programmed states. Following a verify operation, an additional programming pulse Vpgm is applied if there are memory cells that have not completed programming. This process of applying a programming pulse followed by performing a verify operation typically continues until all the selected memory cells have reached their intended programmed states. If a particular number of programming pulses (e.g., maximum number) have been applied and one or more selected memory cells still have not completed programming, those memory cells might be marked as defective, for example.

Figure 2:
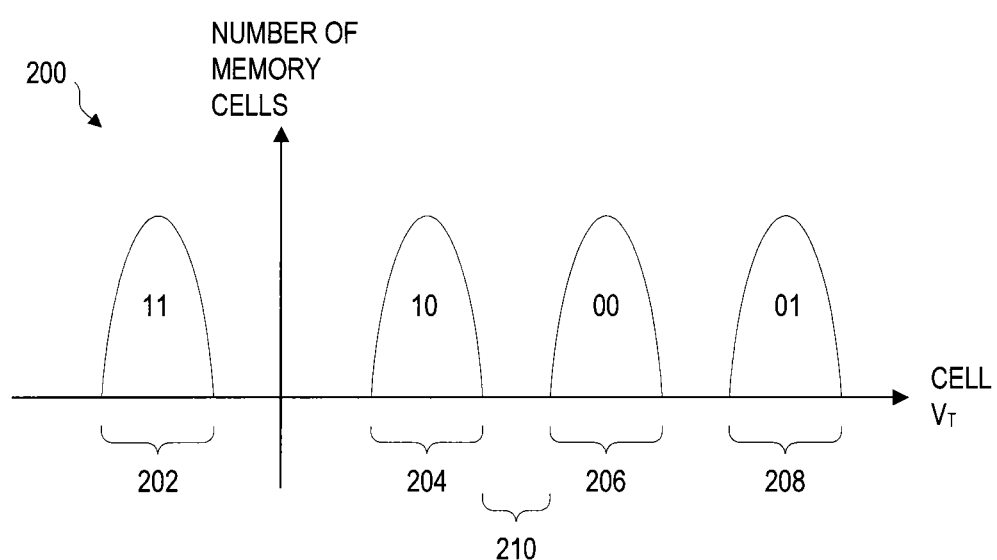
FIG. 2 illustrates a graphical representation of threshold voltage ranges in a population of memory cells.

FIG. 2 illustrates an example of Vt ranges 200 for a population of MLC (four level) (e.g., 2-bit) memory cells. For example, a memory cell might be programmed to a Vt that falls within one of four different Vt ranges 202-208 of 200 mV, each being used to represent a data state corresponding to a bit pattern comprised of two bits. Typically, a dead space 210 (e.g., sometimes referred to as a margin and might have a range of 200 mV to 400 mV) is maintained between each range 202-208 to keep the ranges from overlapping. As an example, if the Vt of a memory cell is within the first of the four Vt ranges 202, the cell in this case is storing a logical '11' state and is typically considered the erased state of the cell. If the Vt is within the second of the four Vt ranges 204, the cell in this case is storing a logical '10' state. A Vt in the third Vt range 206 of the four Vt ranges would indicate that the cell in this case is storing a logical '00' state. Finally, a Vt residing in the fourth Vt range 208 indicates that a logical '01' state is stored in the cell. The number of levels of programming which might be realized in memory cells (e.g., the potential number of data states to which the cells may be programmed) is sometimes referred to as 'density.' Memory cells programmed as MLC(eight-level) memory cells might be considered to be programmable to a higher density than memory cells which are programmable as MLC(four-level) memory cells, for example.

Figure 3:
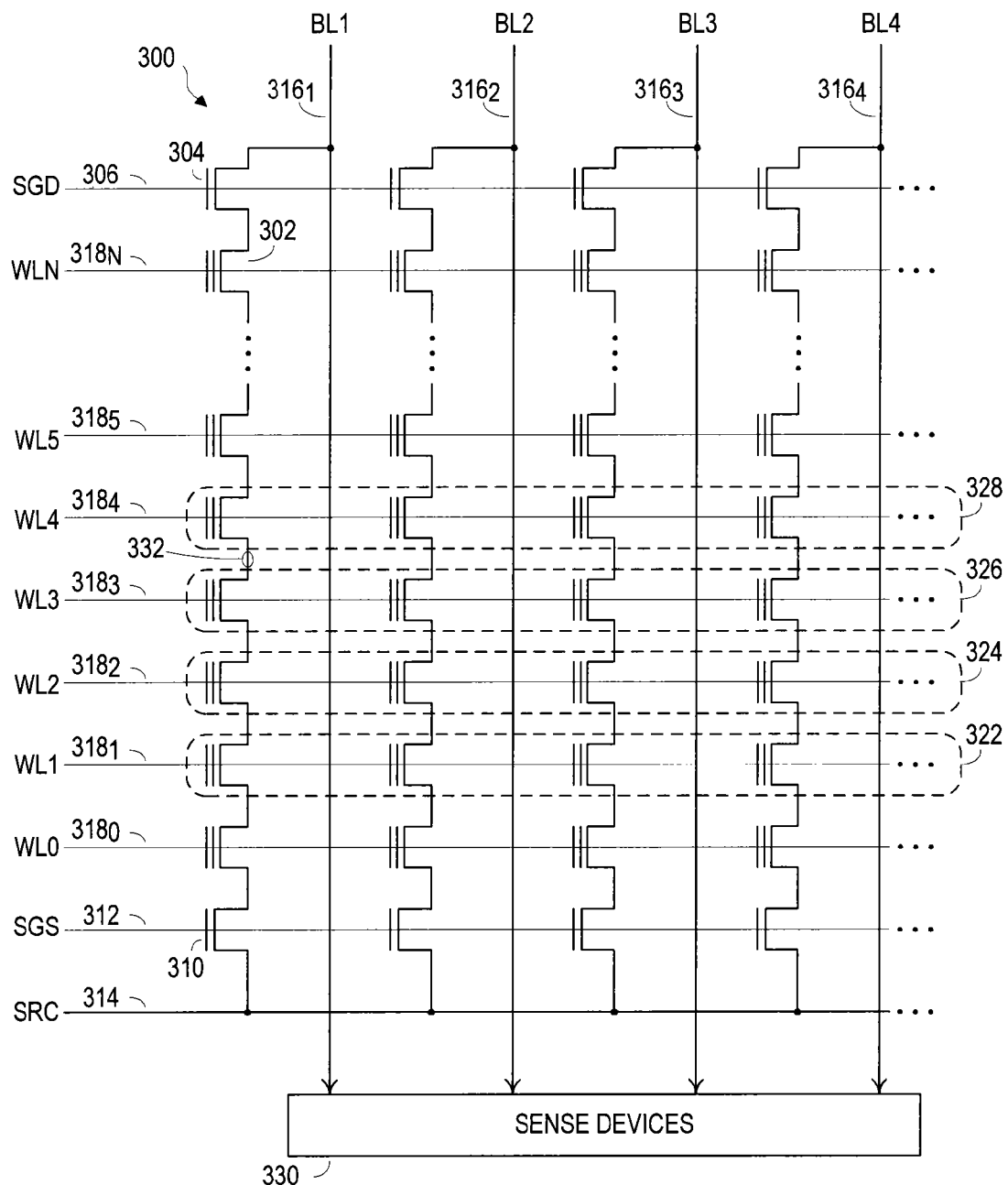
FIG. 3 illustrates a schematic representation of a 2D array of NAND configured memory cells.

A method of programming memory cells of an array of memory cells according to various embodiments of the present disclosure might be described by reference to FIG. 3. FIG. 3 illustrates a schematic representation of a 2D (e.g., planer) All Bit Line (ABL) NAND architecture memory array 300. In an ABL architecture memory device such as shown in FIG. 3, memory cells 302 of the memory array 300 are logically arranged in an array of rows and columns. Each column of memory cells 302 is coupled between a drain select gate 304 and a source select gate 310. Each row (e.g., 328) of memory cells 302 is coupled to a word line 318. As depicted in FIG. 3, each memory cell 302 of a row (e.g., 328) of memory cells 302 shares a source/drain region 332 with a corresponding memory cell 302 of an adjacent row (e.g., 326) of memory cells 302.

During a programming operation performed on selected memory cells of an ABL architecture memory device, such as represented by FIG. 3, each of the bit lines 316 coupled to memory cells of the selected row can be concurrently selected to facilitate performing a program operation on all of the memory cells of the selected row. Concurrently programming memory cells means that the programming of the selected row of memory cells occurs simultaneously for at least a portion of the program operation. For example, programming of those memory cells may be initiated for all of those memory cells at the same time, but one or more of the memory cells may complete their programming prior to other memory cells. Following a programming operation, each of the memory cells of the selected row might be concurrently sensed (e.g., read) to determine if the selected memory cells have reached their intended program states. This is in contrast with an alternating bit line (e.g., shielded bit line) architecture memory device wherein alternating bit lines are selected and memory cells coupled to selected bit lines of a selected row are programmed during a first portion of the programming operation. Subsequently, the remaining memory cells of the selected row in the alternating bit line memory device are programmed during a second portion of the programming operation of a selected row.

Referring again to FIG. 3, the memory cells of a first selected row of memory cells, such as memory cells of row 322, might be concurrently programmed as single level memory cells according to various embodiments of the present description. The memory cells of a second selected row of memory cells, such as memory cells of row 324, might be concurrently programmed as multi-level memory cells during a subsequent programming operation, such as MLC (four-level), for example. Memory cells of a third selected row of memory cells, such as memory cells of row 326, might be concurrently programmed as single level memory cells. The memory cells of a fourth selected row of memory cells, such as memory cells of row 328, might be concurrently programmed as multi-level memory cells, such as MLC (four-level), for example. Thus, according to various embodiments of the present disclosure, memory cells comprising alternating rows of memory cells might be programmed as SLC memory cells. During subsequent programming operations, the memory cells of each remaining row (e.g., alternate rows) of memory cells might be concurrently programmed as MLC memory cells. In an ABL architecture memory array, each bit line of a plurality of bit lines are concurrently configured for programming during a programming operation performed on each row of memory cells of the array. It should be noted that rows of memory cells, such as rows 322-328, might be programmed in an order other than discussed above according to one or more embodiments of the present disclosure.

Methods according to various embodiments of the present disclosure are not limited to programming a first number of rows (e.g., alternating rows) of memory cells as SLC memory and a second number of alternating rows of memory cells as MLC (two-level) memory as discussed above. Each row of the array might be programmed to different densities, for example. Still further embodiments might comprise programming rows to one of a plurality of densities wherein each row is separated from another row by rows of memory cells programmed to each other density of the plurality of densities. For example, rows of memory cells might be programmed to one of three densities where each row programmed to a first density is separated by a row of memory cells programmed to a second density and a row of memory cells programmed to a third density. Thus, methods according to one or more embodiments might facilitate programming three or more groups of rows of memory cells each to different densities (e.g., different levels), for example.

As discussed above, various embodiments are not limited to programming only alternating rows of memory cells as SLC memory and MLC memory. For example, a first number of rows (e.g., alternating rows) of memory cells might be programmed to a first density (e.g., MLC(four-level)) and a second number of rows (e.g., alternating rows) of memory cells might be programmed to a second density (e.g., MLC (eight-level)) memory.

Figure 4:
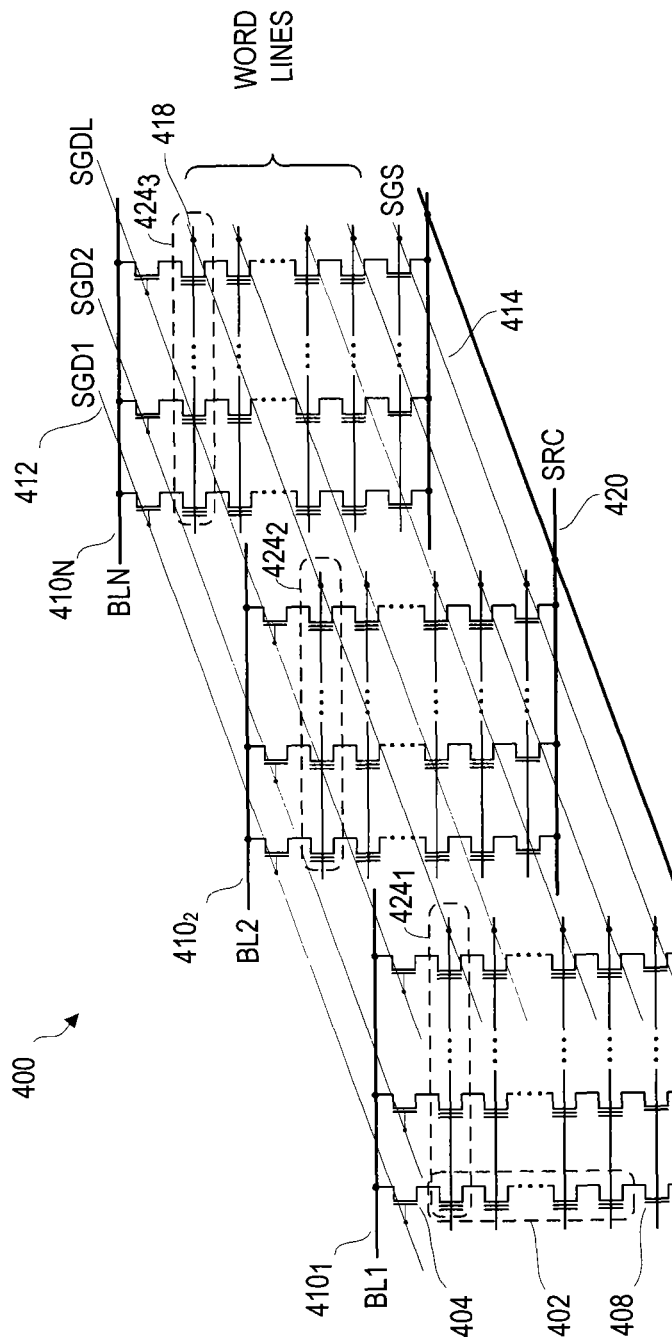
FIG. 4 illustrates a schematic representation of a portion of a 3D array of NAND configured memory cells.

As discussed above, various memory architectures (e.g., non-volatile memory architectures) are utilized to increase the memory capacity of memory devices. One such architecture is referred to as three-dimensional (3D) memory which incorporates vertical structures which may include semiconductor pillars where at least a portion of each pillar acts as a channel region of the memory cells. FIG. 4 illustrates a schematic representation of a 3D all bit line (ABL) architecture NAND memory array 400. The NAND strings of memory cells 402 are each coupled to a bit line BL1-BLN 410 by a drain select gate 404 and to a source SRC 420 by a source select gate 408. Multiple strings of memory cells might be coupled to the same bit line. Individual memory cell strings can be selected by biasing the SGD lines 412 coupled to activate particular drain select gates 404 between each string of memory cells 402 and a bit line 410. The source select gates 408 can be activated by biasing the SGS signal line 414.

Each word line 418 is coupled to multiple rows of memory cells 424 of the 3D array. Rows which are commonly coupled to each other by a particular word line, such as rows $424_1$-$424_3$ coupled by word line 418, comprise what are referred to as tiers. However, various embodiments according to the present disclosure are not limited to tiers comprising three rows of memory cells, such as rows $424_1$-$424_3$ shown in FIG. 4, for example. Thus, a tier according to one or more embodiments can comprise a plurality of rows of memory cells coupled by a particular word line. 3D arrays, such as illustrated by FIG. 4, can comprise multiple tiers of memory cells, for example.

Figure 5:
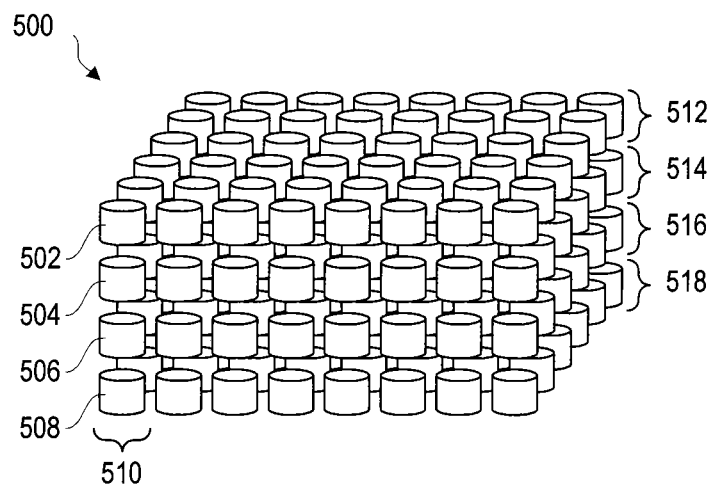
FIG. 5 illustrates an illustration of a portion of a 3D array of NAND configured memory cells.

FIG. 5 illustrates a representation of a portion of a 3D array of memory cells 500, such as a portion of a 3D ABL architecture NAND memory device, for example. The figure has been simplified to improve readability. Each cylinder 502 shown in FIG. 5 is representative of a memory cell of the 3D array of memory cells 500, for example. Strings of memory cells are made up of vertically formed stacks (e.g., columns) 510 of memory cells. For example, memory cells 502, 504, 506 and 508 might comprise a vertically formed string of memory cells such as the string of memory cells 402 shown in FIG. 4, for example. Each column of memory cells 510 is coupled between a source and a respective bit line (not shown in FIG. 5), such as between source SRC 420 and bit lines 410, respectively, as shown in FIG. 4.

Figure 6:
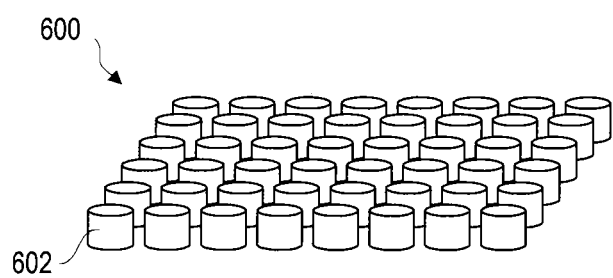
FIG. 6 illustrates a graphical representation of a single tier of memory cells.

FIG. 5 further illustrates that the 3D array of memory cells 500 is further arranged in a number of tiers 512-518 of memory cells. For example, the uppermost tier 512 of memory cells of the array 500 might comprise a first tier of memory cells. The tier 514 of memory cells below tier 512 might comprise a second tier of memory cells, and so on. FIG. 6 illustrates a single tier (e.g., plane) 600 of memory cells 602. Thus, the 3D ABL architecture array of memory cells 500 shown in FIG. 5 might comprise a stack of four planes of memory cells 600 such as shown in FIG. 6. Each column of memory cells 510 comprises a memory cell 502-508 from each tier 512-518 of memory cells of the 3D memory array 500.

Each tier of memory cells 512-518 has a particular word line (not shown in FIG. 5) associated with it. For example, the memory cells comprising the uppermost tier 512 of memory cells might be coupled to a single word line, such as word line 418 shown in FIG. 4, for example. The remaining tiers 514-518 of memory cells shown in FIG. 5 are each coupled to their own respective word lines (not shown in FIG. 5). Thus, in a 3D ABL architecture memory array, such as illustrated in FIG. 5, each memory cell of a particular tier of memory cells might be programmed by biasing the associated word line and each of the plurality of bit lines coupled to the strings of memory cells comprising the particular tier of memory cells. According to various embodiments, a first tier of memory cells might be programmed as SLC memory, a second tier might be programmed as MLC memory, a third tier might be programmed as SLC memory, and so on.

A programming method according to one or more embodiments of the present disclosure can be discussed by way of example with reference to FIG. 5. Memory cells of the first tier of memory cells 512 might be selected for programming during a first programming operation. As the word line coupled to the first tier is coupled to each memory cell of the first tier, each memory cell of the first tier will be biased to one or more programming pulses applied to the first word line. Each bit line of the array coupled to each memory cell of the first tier of memory cells is also configured to allow concurrent programming of memory cells of the first tier. Word lines coupled to remaining tiers of memory cells might be biased such as to mitigate programming (e.g., further programming) of memory cells comprising the remaining tiers of memory cells.

Tiers of memory cells might also be sensed, such as part of a memory device read operation, at the particular density to which each tier of memory cells has been programmed to. For example, tiers of memory cells programmed as SLC memory cells can be sensed (e.g., read) as SLC memory cells. Tiers of memory cells programmed as MLC memory cells can be sensed (e.g., read) as MLC memory cells, etc. Word lines coupled to tiers of unselected memory cells might be biased to a Vpass potential to activate the unselected memory cells to operate in a pass through mode regardless of their respective programmed states while the selected memory cells are sensed.

Thus, according to various embodiments of the present disclosure, alternating tiers of memory cells in a 3D ABL architecture NAND memory device might be programmed to a first program density and different alternating tiers of memory cells might be programmed to a second program density. For example, a particular tier of memory cells might be programmed as MLC memory cells. A tier above and below (e.g., directly above and below) the particular tier of memory cells might be programmed as SLC memory. This facilitates tailoring a trade-off between capacity and reliability in programming the memory array. For example, an average of 1.5 bits per memory cell might be realized by programming half of the tiers as SLC memory cells and programming the other half of tiers as MLC(four-level) (e.g., MLC(two-bit)) memory cells, for example. Different combinations of memory cell program densities might be utilized according to various embodiments of the present disclosure. Each tier of tiers 512-518 might be programmed to a different density, for example.

Figure 7:
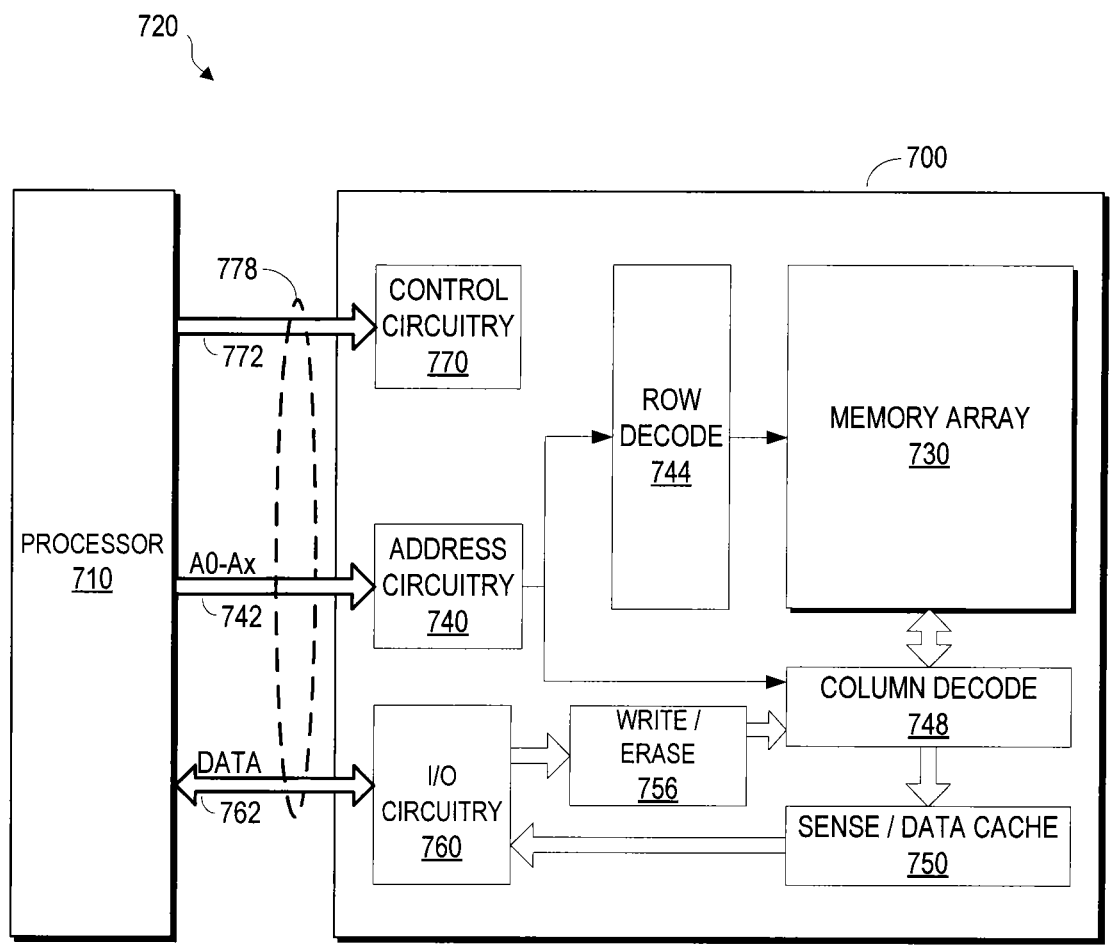
FIG. 7 is a simplified block diagram of a memory device coupled to a memory access device as part of an electronic system according to an embodiment of the present disclosure.

FIG. 7 is a functional block diagram of an electronic system having at least one apparatus, such as a memory device 700, according to one or more embodiments of the present disclosure. As used herein, an 'apparatus' can refer to, but is not limited to, an array, circuitry, a device or devices, a semiconductor die or dies, a module or modules and/or a system or systems, for example. The memory device 700 illustrated in FIG. 7 is coupled to a memory access device, such as a processor 710. The processor 710 may be a microprocessor or some other type of controlling circuitry. The memory device 700 and the processor 710 form part of an electronic system 720. The memory device 700 has been simplified to focus on features of the memory device that are helpful in understanding various embodiments of the present disclosure.

The memory device 700 includes one or more memory arrays 730 that might be logically arranged in rows and columns and may be further configured as all bit line (ABL) memory arrays. The one or more memory arrays 730 might comprise 2D and/or 3D memory arrays. According to various embodiments of the present disclosure, the memory cells of memory array 730 are flash memory cells configured as a 2D ABL architecture NAND memory array. According to one or more embodiments, the memory cells of memory array 730 are flash memory cells configured as a 3D ABL architecture NAND memory array. The memory array 730 might include multiple banks and blocks of memory cells residing on a single or multiple die as part of the memory device 700. Memory array 730 might comprise SLC and/or MLC memory. The memory array 730 might also be adaptable to store varying densities (e.g., MLC(four-level) and MLC(eight-level)) of data in each memory cell, for example.

An address buffer circuit 740 is provided to latch address signals provided on address input connections A0-Ax 742. Address signals are received and decoded by a row decoder 744 and a column decoder 748 to access the memory array 730. Row decoder 744 might comprise driver circuitry configured to bias the word lines of the memory array 730, for example. It will be appreciated by those skilled in the art, with the benefit of the present description, that the number of address input connections 742 might depend on the architecture of the memory array 730. That is, the number of address digits increase with both increased memory cell counts and increased bank and block counts, for example.

The memory device 700 reads data in the memory array 730 by sensing voltage or current changes in the memory array columns using sense devices, such as sense/data cache circuitry 750. The sense/data cache circuitry 750, in at least one embodiment, is coupled to read and latch a row of data from the memory array 730. The sense/data cache circuitry 750 might comprise driver circuitry to bias bit lines to various potentials according to one or more embodiments of the present disclosure. Data input and output (I/O) buffer circuitry 760 is included for bi-directional data communication over a plurality of data connections 762 with the processor 710. Write/erase circuitry 756 is provided to write data to or to erase data from the memory array 730.

Control circuitry 770 is configured, at least in part, to facilitate implementing various embodiments of the present disclosure. Control circuitry 770 might be coupled (not shown in FIG. 7) to one or more of the elements of the memory device 700. For example, the control circuitry might be coupled to the row decoder 744 and configured to cause the row decoder driver circuitry to bias particular word lines of the memory array 730 according to various embodiments of the present disclosure. Control circuitry 770 might be coupled (not shown in FIG. 7) to and configured to cause the sense/data cache driver circuitry 750 to bias particular bit lines of the array 730 according to one or more embodiments. For example, the control circuitry might be configured to operate the memory array 730 as an ABL memory array. Control circuitry 770 might further comprise one or more register circuits. Programming these registers facilitates configuring the memory device to program and/or sense the memory cells in the memory array according to various embodiments as discussed above. For example, one or more registers might be programmed to indicate (e.g., assign) which rows and/or tiers of memory cells are to be programmed as SLC or a particular level of MLC memory cells such as described above. In one or more embodiments, control circuitry 770 and/or firmware or other circuitry can individually, in combination, or in combination with other elements, form an internal controller. As used herein, however, a controller need not necessarily include any or all of such components. In some embodiments, a controller can comprise an internal controller (e.g., located on the same die as the memory array) and/or an external controller. In at least one embodiment, the control circuitry 770 may utilize a state machine.

Control signals and commands can be sent by the processor 710 to the memory device 700 over the command bus 772. The command bus 772 may be a discrete signal or may be comprised of multiple signals, for example. These command signals 772 are used to control the operations on the memory array 730, including data read, data write (e.g., program), and erase operations. The command bus 772, address bus 742 and data bus 762 may all be combined or may be combined in part to form a number of standard interfaces (e.g., communications interfaces) 778. For example, the interface 778 between the memory device 700 and the processor 710 might be a Universal Serial Bus (USB) interface. The interface 778 might also be a standard interface used with many hard disk drives (e.g., SATA, PATA) as are known to those skilled in the art.

The electronic system illustrated in FIG. 7 has been simplified to facilitate a basic understanding of the features of the memory and is for purposes of illustration only. A more detailed understanding of internal circuitry and functions of non-volatile memories are known to those skilled in the art.

CONCLUSION

In summary, one or more embodiments of the present disclosure provide methods of programming and sensing memory cells in memory arrays, such as 2D ABL and/or 3D ABL architecture NAND memory arrays. The programming and/or sensing operations discussed above according to various embodiments might be performed on a number of memory array configurations such as the 3D ABL architecture NAND memory arrays as well as 2D ABL architecture NAND memory arrays. Memory cells comprising alternating rows and/or tiers of memory cells might be programmed and/or sensed at different program densities than other rows and/or tiers of memory cells of a memory array. These methods might facilitate selecting a desired level of expected reliability in the memory array while facilitating an increase in data storage density in the memory array. A reduction in program disturb might also be realized.

Although specific embodiments have been illustrated and described herein, it will be appreciated by those of ordinary skill in the art that other configurations may be substituted for the specific embodiments shown. Many adaptations of the disclosure will be apparent to those of ordinary skill in the art. Accordingly, this application is intended to cover any adaptations or variations of the disclosure.

What is claimed is:

1. A method of operating a memory device having an array of memory cells logically arranged in tiers and in columns where each column is coupled to a respective one of a plurality of data lines and where each tier comprises a plurality of rows of memory cells, the method comprising:
   concurrently programming a selected memory cell of each row of memory cells comprising a first tier of memory cells at a first density; and
   concurrently programming a selected memory cell of each row of memory cells comprising a second tier of memory cells at a second density different than the first density.

2. The method of claim 1, further comprising concurrently programming a selected memory cell of each row of memory cells comprising a third tier of memory cells at a third density different than the first density and the second density.

3. The method of claim 1, wherein concurrently programming a selected memory cell of each row of memory cells comprising the first tier of memory cells at a first density further comprises programming each memory cell of the first tier of memory cells as single level memory cells, and where concurrently programming a selected memory cell of each row of memory cells comprising the second tier of memory cells at a second density further comprises programming each memory cell of the second tier of memory cells as multilevel memory cells.

4. The method of claim 1, wherein concurrently programming a selected memory cell of each row of memory cells comprising the first tier of memory cells at a first density further comprises programming each memory cell of the first tier of memory cells as multilevel cells having a first level, and where concurrently programming a selected memory cell of each row of memory cells comprising the second tier of memory cells at a second density further comprises programming each memory cell of the second tier of memory cells as multilevel memory cells having a second level.

5. The method of claim 1, wherein each row of the first tier of memory cells comprises two or more adjacent memory cells commonly coupled to a first access line, and where each row of the second tier of memory cells comprises two or more adjacent memory cells commonly coupled to a second access line.

6. The method of claim 5, wherein memory cells comprising the first tier of memory cells are commonly coupled to the first access line, and where memory cells comprising the second tier of memory cells are commonly coupled to the second access line.

7. The method of claim 6, wherein each memory cell of the first tier of memory cells shares a source/drain region with a corresponding memory cell of the second tier of memory cells.

8. The method of claim 1, further comprising concurrently programming a selected memory cell of each row of memory cells comprising a third tier of memory cells at the first density, wherein the first tier of memory cells is adjacent to the second tier of memory cells and where the second tier of memory cells is adjacent to the third tier of memory cells.

9. The method of claim 8, further comprising concurrently programming a selected memory cell of each row of memory cells comprising a fourth tier of memory cells at the second density, wherein the third tier of memory cells is adjacent to the fourth tier of memory cells.

10. A method of operating a memory device having an array of memory cells logically arranged in tiers and in columns where each column is coupled to a respective one of a plurality of data lines and where each tier comprises a plurality of rows of memory cells, the method comprising:
concurrently programming a selected memory cell of each row of memory cells comprising a first tier of memory cells to a respective one of a first number of data states; and
concurrently programming a selected memory cell of each row of memory cells comprising a second tier of memory cells to a respective one of a second number of data states after programming a selected memory cell of each row of memory cells comprising the first tier of memory cells;
wherein the first number of data states is different than the second number of data states;
wherein at least one column of the array of memory cells comprises a memory cell of the first tier of memory cells and a memory cell of the second tier of memory cells.

11. An apparatus, comprising:
an array of memory cells logically arranged in tiers and in columns, where each column is coupled to a respective data line and where each tier comprises a plurality of rows of memory cells commonly coupled to a respective access line; and
a controller, wherein the controller is configured to cause a selected memory cell of each row of memory cells comprising a first tier of memory cells to be concurrently programmed to a respective one of a first number of data states, and to cause a selected memory cell of each row of memory cells comprising a second tier of memory cells to be concurrently programmed to a respective one of a second number of data states;
wherein the first number of data states is different than the second number of data states.

12. The apparatus of claim 11, wherein the controller is further configured to cause a selected memory cell of each row of memory cells comprising a third tier of memory cells to be concurrently programmed to a respective one of the first number of data states, where the second tier of memory cells is between the first tier of memory cells and the third tier of memory cells.

13. The apparatus of claim 11, wherein each data line comprises a bit line and where the memory array comprises a three-dimensional (3D) all bit line (ABL) architecture memory array.

14. The apparatus of claim 11, wherein the controller is further configured to cause each memory cell of the first tier of memory cells to be programmed to a respective one of the first number of data states, and to cause each memory cell of the second tier of memory cells to be programmed to a respective one of the second number of data states.

15. The apparatus of claim 11, wherein the controller is further configured to cause each memory cell comprising a first number of alternating tiers of memory cells to be programmed to a respective one of the first number of data states, and to cause each memory cell comprising a second number of alternating tiers of memory cells to be programmed to a respective one of the second number of data states.

16. A memory device, comprising:
an array of memory cells logically arranged in tiers and in columns, where each column is coupled to a respective data line and where each tier comprises a plurality of rows of memory cells commonly coupled to a respective access line; and
a controller, wherein the controller is configured to cause a selected memory cell of each row of memory cells comprising a first tier of memory cells to be concurrently programmed as single level memory cells, and to cause a selected memory cell of each row of memory cells comprising a second tier of memory cells to be concurrently programmed as multi-level memory cells;
wherein the first tier of memory cells comprises two or more adjacent memory cells commonly coupled to a first access line;
wherein the second tier of memory cells comprises two or more adjacent memory cells commonly coupled to a second access line; and
wherein each memory cell of the first tier of memory cells shares a drain/source region with a corresponding memory cell of the second tier of memory cells.

17. The memory device of claim 16, wherein the controller is further configured to cause a first plurality of alternating tiers of memory cells to be programmed as single level memory cells and to cause a second plurality of alternating tiers of memory cells to be programmed as multi-level memory cells.

* * * * *